(12) United States Patent
Yu

(10) Patent No.: US 7,733,627 B2
(45) Date of Patent: Jun. 8, 2010

(54) STRUCTURE OF EMBEDDED CAPACITOR

(76) Inventor: Wan-Ling Yu, 11-6F, No. 165, Sec. 5, Ming-Shen E. Road, Taipei (TW)

(*) Notice: Subject to any disclaimer, the term of this patent is extended or adjusted under 35 U.S.C. 154(b) by 429 days.

(21) Appl. No.: 11/860,316

(22) Filed: Sep. 24, 2007

(65) Prior Publication Data

US 2009/0080139 A1 Mar. 26, 2009

(51) Int. Cl.
*H01G 4/228* (2006.01)
(52) U.S. Cl. .............. 361/306.2; 361/303; 361/306.1; 361/763; 361/764; 361/782
(58) Field of Classification Search .......... 361/306.2, 361/306.1, 306.3, 303–305, 301.2, 763, 764, 361/765, 782; 174/259–261
See application file for complete search history.

(56) References Cited

U.S. PATENT DOCUMENTS

| 5,079,069 | A | 1/1992 | Howard et al. |
| 5,155,655 | A | 10/1992 | Howard et al. |
| 5,161,086 | A | 11/1992 | Howard et al. |
| 6,346,743 | B1 * | 2/2002 | Figueroa et al. ............. 257/723 |
| 7,186,919 | B2 * | 3/2007 | Kim et al. .................... 174/250 |
| 7,301,751 | B2 * | 11/2007 | Lee et al. ..................... 361/311 |
| 7,339,798 | B2 * | 3/2008 | Chakravorty ................ 361/782 |
| 7,361,568 | B2 * | 4/2008 | Dunn et al. .................. 438/381 |
| 7,417,870 | B2 * | 8/2008 | Lim et al. .................... 361/763 |

* cited by examiner

*Primary Examiner*—Nguyen T Ha
(74) *Attorney, Agent, or Firm*—Birch, Stewart, Kolasch & Birch, LLP

(57) ABSTRACT

The embedded capacitor of the present invention contains a power plate, a ground plate, and a dielectric layer vertically sandwiched between the power and ground plates. Both the power and ground plates are divided laterally into a number of smaller plates with appropriate gaps therebetween; and, as such, cracks in the dielectric layers are limited to happen between gaps only. The smaller plates are then electrically connected by connectors in the gaps. The connectors for the power plate and the connectors for the ground plate are not vertically overlapped so that they do not appear simultaneously at the two ends of the cracks simultaneously.

7 Claims, 3 Drawing Sheets

STRUCTURE OF EMBEDDED CAPACITOR

BACKGROUND OF THE INVENTION

1. Field of the Invention

The present invention generally relates to laminated printed circuit boards, and more particularly to an embedded capacitor structure for laminated printed circuit boards.

2. The Prior Arts

Embedding capacitors in laminated printed circuit boards (PCBs) were originally disclosed by a U.S. company, Zycon, in 1992. In a PCB's laminated process, Zycon proposed to add extremely thin (e.g., 2-4 mil) dielectric layer and copper foil adjacent to the power plane or ground plane of the PCB so as to form embedded capacitors integral to the PCB. At that time, it was referred to as buried capacitors (BC). The advantages of embedded capacitors usually cited are low noises under high frequency operation and PCB's real estate saving. Zycon had also been granted a number of related patents such as U.S. Pat. Nos. 5,079,069, 5,161,086, 5,155,655, etc. However, the technology at that time could only achieve embedded capacitors with limited capacitance and therefore failed to gain widespread popularity.

To increase the capacitance of embedded capacitors, it has been suggested to first form a dielectric layer of high dielectric constant on the power or ground plane of the PCB by ion sputtering, then to form a metallic thin layer on the dielectric layer by ion sputtering or electroless plating, and finally to increase the thickness of the thin metallic layer as an electrode by electroplating. The teaching is able to achieve high capacitance from embedded capacitors by significantly reducing the distance between the electrodes and by adopting dielectric material of high dielectric constant.

However, this teaching has certain reliability issues. The resin glass fabrics, a major material for the PCB, has different thermal expansion coefficient from those of the copper foil and the dielectric material. The differences are even more significant when the temperature is beyond the glass transition temperature. Therefore, when a heat source is involved (for example, for soldering) in the PCB manufacturing process after the embedded capacitors are formed, the stress resulted from the differences of the thermal expansion coefficients would cracks the dielectric layer. Further, due to copper's Conductive Anodic Filament (CAF) effect, the copper foils at the two sides of a crack of the dielectric layer would be shorted after a period of usage. The embedded capacitor, and the entire PCB, therefore fails.

SUMMARY OF THE INVENTION

Accordingly, a novel embedded capacitor structure is provided herein to limit the cracks resulted from thermal stress to happen only in certain areas of the dielectric layer and to prevent the cracks from connecting the electrode plates of the embedded capacitor.

To achieve the foregoing objective, the embedded capacitor of the present invention contains a power plate, a ground plate, and a dielectric layer vertically sandwiched between the power and ground plates. Both the power and ground plates are divided laterally into a number of smaller plates with appropriate gaps therebetween; and, as such, cracks in the dielectric layers are limited to happen between gaps only. The smaller plates are then electrically connected by connectors in the gaps. The connectors for the power plate and the connectors for the ground plate are not vertically overlapped so that they do not appear simultaneously at the two ends of the cracks simultaneously.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 1b is a sectional view showing the embedded capacitor of FIG. 1a.

DETAILED DESCRIPTION OF THE PREFERRED EMBODIMENT

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
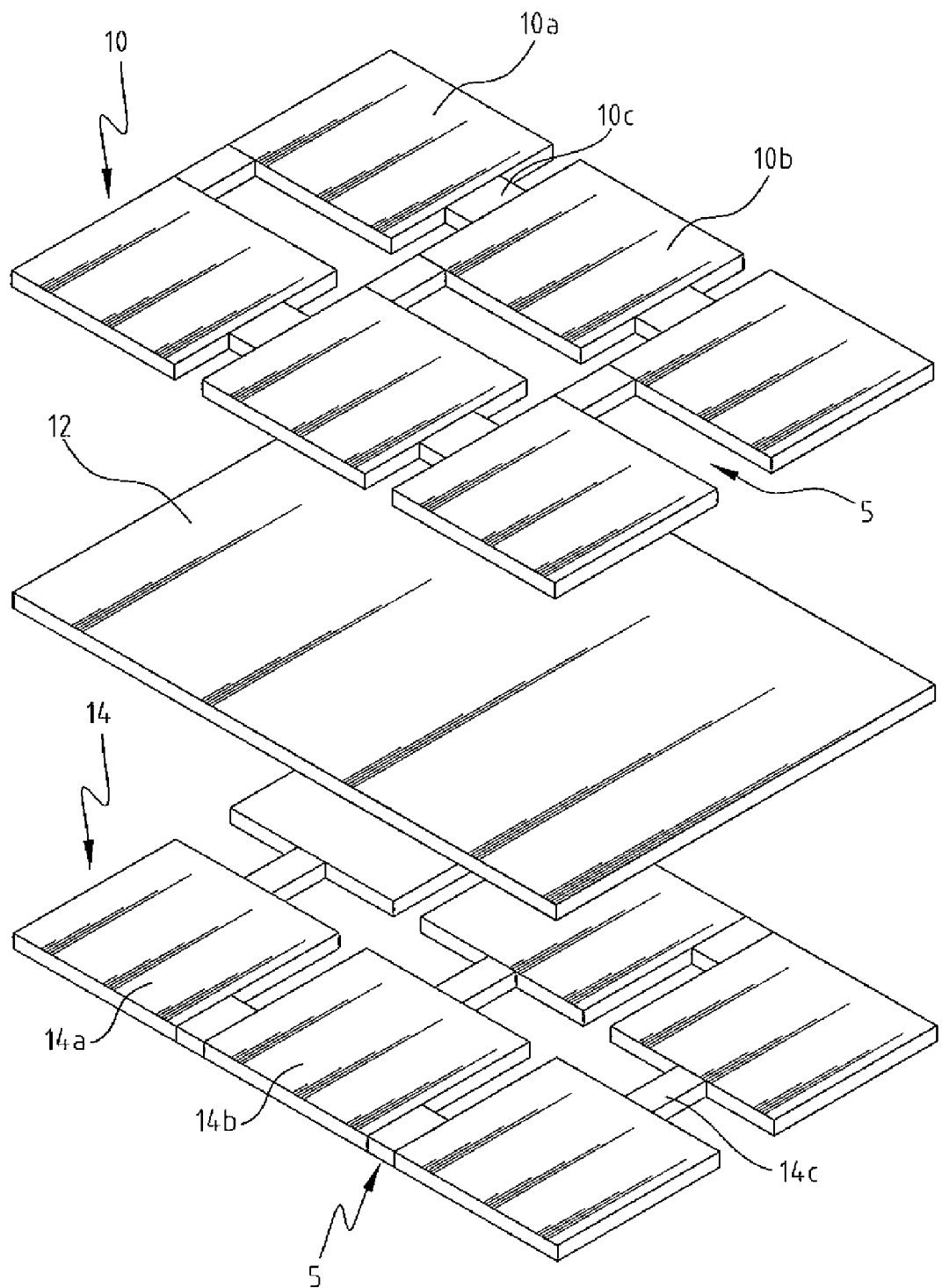
FIG. 1a is a perspective exploded view showing the structure of an embedded capacitor according to an embodiment of the present invention.
Figure 1B:
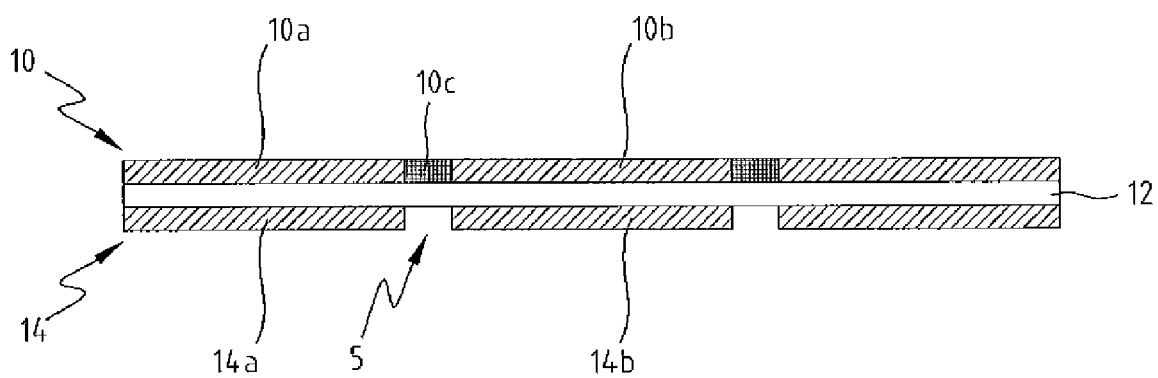

FIGS. 1a and 1b are perspective and sectional views showing the structure of an embedded capacitor according to an embodiment of the present invention. As illustrated, the embedded capacitor mainly contains a power plate 10, a ground plate 14, and a dielectric layer 12 vertically sandwiched between the power and ground plates 10 and 14. In a laminated printed circuit board, the power plate 10 could be the power plane of the printed circuit board or the ground plate 14 could be the ground plane of the printed circuit board. To form the embedded capacitor, a dielectric material of high dielectric constant is formed on one of the power plane (e.g., the power plate 10) or the ground plane (e.g., the ground plate 14) as the dielectric layer 12 by ion sputtering. The other plate is a metallic layer then formed on the dielectric layer 12 either by ion sputtering and electroplating, or by electroless deposition and electroplating. Then, wiring layout is deployed to connect the two plates so as to form the embedded capacitor.

To prevent the stress of thermal expansion from damaging the embedded capacitor, the power plate 10 and the ground plate 14 are laterally divided into a number of smaller metallic plates 10a and 10b, and 14a and 14b, respectively, with appropriate gaps 5 between adjacent smaller plates 10a and 10b, and between adjacent smaller plates 14a and 14b. Each pair of adjacent smaller plates 10a and 10b has a connector 10c in the gap 5 therebetween for electrical connectivity. Similarly, each pair of adjacent smaller plates 14a and 14b has a connector 14c in the gap 5 therebetween for electrical connectivity. The part of the dielectric layer 12 that are covered by the smaller plates 10a, 10b, 14a, and 14b are more capable of sustaining the stress resulted from the thermal expansion of resin glass fabrics of the printed circuit board. On the other hand, the part of the dielectric layer 12 between corresponding gaps 5 of the power and ground plates 10 and 14, as covered by much smaller connectors 10c and 14c, is less robust to the stress. As such, the cracks in the dielectric layer 12 are most likely to happen only in the part of the dielectric layer 12 between corresponding gaps 5 of the power and ground plates 10 and 14, instead of between the smaller power and ground plates 10a, 10b, 14a, and 14b.

Please note that the dimensions of the smaller plates 10a, 10b, 14a, and 14b, the gaps 5, and the connectors 11c and 14c could be varied in accordance with the material, the thickness, and the wiring of the printed circuit board.

Please also note that the connectors 10c and 14c are formed such that they are not vertical overlapped (i.e., one connector does not fall within the vertical projection of another connector). The reason for such arrangement is as follows. As mentioned, cracks are limited to happen only in the part of the dielectric layer 12 between gaps 5 of the power and ground plates 10 and 14, due to the partition of the power and ground plates 10 and 14. However, since connectors 10c and 14c in the gaps 5 are not overlapped, they will not appear at the two ends of a crack respectively and simultaneously, and the CAF effect thereby will not short-circuit the connectors 10c and 14c. In this way, the embedded capacitor formed according to the present invention will remain intact even though significant heat is introduced in the subsequent manufacturing process.

Figure 2:
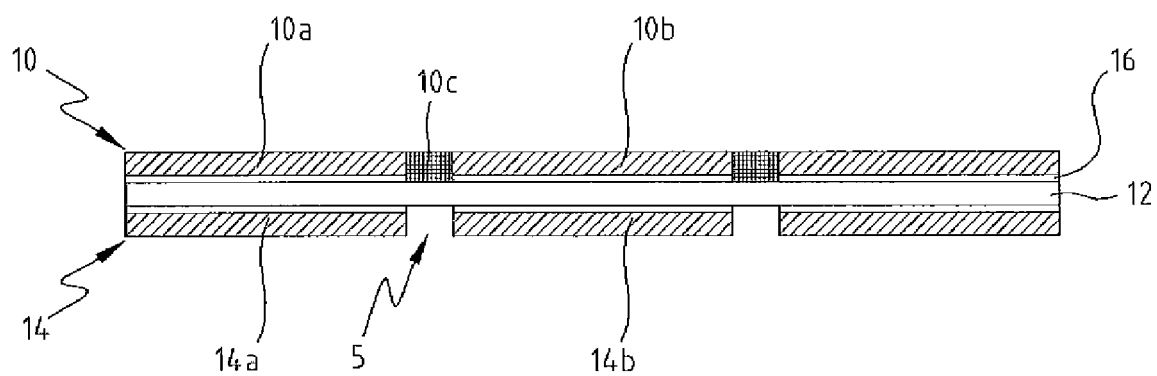
FIG. 2 is a sectional view showing an embedded capacitor according to another embodiment of the present invention.

If a crack is really long, there is still some possibility that some connectors 10c and 14c could be connected the crack and then short-circuited by the CAF effect. To prevent this from happening, another embodiment of the present invention is shown in FIG. 2. As illustrated, a metallic layer 16 made of nickel or similar metallic material that is substantially incapable of producing dendrite or CAF effect is formed on a side of the dielectric layer 12 (e.g., between the dielectric layer 12 and the power plate 10). Please note that the metallic layer 16 is not required to cover the entire dielectric layer 12; the metallic layer 16 can just cover the areas where the smaller plates 10a, 10b and the connectors 10c are located. Please also note that the metallic layer 16 can also be formed between the dielectric layer 12 and the ground plate 14, or between the dielectric layer 12 and the smaller plates 14a, 14b and the connectors 14c.

In the foregoing embodiments, as illustrated, there is a single straight connector 10c (and 14c) between two smaller plates 10a and 10b (and between 14a and 14b). However, in alternative embodiments, there could be multiple connectors 10c (and 14c) between two smaller plates 10a and 10b (and between 14a and 14b). In addition, the connectors 10c and 14c are not required to be straight ones; they could be curved ones or ones having multiple linear or curved segments. Further more, in the foregoing embodiments, all the smaller plates 10a and 10b of the power plate 10 are electrically connected by the connectors 10c; and all the smaller plates 14a and 14b of the ground plate 14 are electrically connected by the connectors 14c. As such, a single embedded capacitor is formed. In alternative embodiments, the smaller plates 10a and 10b (and 14a and 14b) are separated into several groups and only the smaller plates 10a and 10b (and 14a and 14b) in the same group are electrically connected together. As such, several embedded capacitors of varied capacitances are formed.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An embedded capacitor structure for a laminated printed circuit board, comprising:
   a metallic power plate, said power plate having a plurality of smaller first plates, any two adjacent first plates having an appropriate gap therebetween, and said two adjacent first plates being electrically connected by at least a first connector;
   a metallic ground plate, said ground plate having a plurality of smaller second plates, any two adjacent second plates having an appropriate gap therebetween, and said two adjacent second plates being electrically connected by at least a second connector; and
   a dielectric layer vertically sandwiched between said power plate and said ground plate.

2. The embedded capacitor structure according to claim 1, wherein said first connectors and said second connectors are not vertically overlapped.

3. The embedded capacitor structure according to claim 1, further comprising:
   a metallic layer on a side of said dielectric layer; wherein said metallic layer is made of a metallic material that is substantially incapable of producing dendrite or Conductive Anodic Filament effect.

4. The embedded capacitor structure according to claim 1, wherein, there are a plurality first connectors or second connectors between at least a pair of said first plates or a pair of said second plates.

5. The embedded capacitor structure according to claim 1, wherein said dielectric layer is made of a dielectric material of a high dielectric constant by ion sputtering on one of said power plate and said ground plate.

6. The embedded capacitor structure according to claim 1, wherein one of said power plate and said ground plate is formed by ion sputtering and electroplating on said dielectric layer.

7. The embedded capacitor structure according to claim 1, wherein one of said power plate and said ground plate is formed by electroless deposition and electroplating on said dielectric layer.

* * * * *